(12) United States Patent
Iriguchi et al.

(10) Patent No.: US 8,993,412 B1
(45) Date of Patent: Mar. 31, 2015

(54) METHOD FOR REDUCING BACKSIDE DIE DAMAGE DURING DIE SEPARATION PROCESS

(71) Applicant: Texas Instruments Incorporated, Dallas, TX (US)

(72) Inventors: Shoichi Iriguchi, Oita Prefecture (JP); Noboru Nakanishi, Oita Prefecture (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/098,018

(22) Filed: Dec. 5, 2013

(51) Int. Cl.
  *H01L 21/00* (2006.01)
  *H01L 23/00* (2006.01)
  *H01L 21/78* (2006.01)

(52) U.S. Cl.
  CPC ............. *H01L 24/96* (2013.01); *H01L 21/78* (2013.01)
  USPC ........................... 438/460; 438/113; 438/464

(58) Field of Classification Search
  USPC ................ 438/113, 458, 460, 462, 464
  See application file for complete search history.

(56) References Cited

U.S. PATENT DOCUMENTS

| | | | | |
|---|---|---|---|---|
| 7,662,666 | B2 * | 2/2010 | Kondo | 438/109 |
| 7,824,962 | B2 * | 11/2010 | Mariani et al. | 438/110 |
| 7,838,424 | B2 * | 11/2010 | Karta et al. | 438/689 |
| 8,450,187 | B2 * | 5/2013 | Fukuyo et al. | 438/460 |
| 2005/0181540 | A1 * | 8/2005 | Farnworth et al. | 438/113 |
| 2008/0220591 | A1 * | 9/2008 | Nakamura | 438/464 |

* cited by examiner

*Primary Examiner* — Kevin M Picardat
(74) *Attorney, Agent, or Firm* — Steven A. Shaw; Frederick J. Telecky, Jr.

(57) ABSTRACT

In one aspect of the present invention, a method of sawing a semiconductor wafer will be described. A semiconductor wafer is positioned in a wafer sawing apparatus that includes a sawing blade and a movable support structure that physically supports the semiconductor wafer. The semiconductor wafer is coupled with the support structure with various layers, including a dicing tape and an anchoring material. The anchoring material and the wafer are cut with the sawing blade. During the cutting operation, the anchoring material reduces backside chipping of the die and eliminates fly-away die. Various aspects of the present invention relate to arrangements and a wafer sawing apparatus that involve the aforementioned sawing method.

8 Claims, 3 Drawing Sheets

METHOD FOR REDUCING BACKSIDE DIE DAMAGE DURING DIE SEPARATION PROCESS

FIELD OF THE INVENTION

The present invention relates to integrated circuit packages. More specifically, the present invention relates to methods and arrangements for sawing and separating die on a semiconductor wafer.

BACKGROUND OF THE INVENTION

There are a wide variety of ways to form integrated circuits. One conventional approach involves forming various devices and interconnects on a slice of semiconductor material. These operations form multiple copies of the same integrated circuit design 105 on a single semiconductor wafer 101 separated by saw streets.

Referring to FIG. 1, the semiconductor wafer 101 is then diced or sawed to separate the integrated circuits using a sawing machine (not shown).

The sawing machine (not shown) is comprised of a saw blade 102, a motor (not shown) driving the saw blade 102 and a chuck table 103 that moves back and forth under saw blade to make linear cuts along the saw streets of a wafer.

A wafer is mounted on the chuck table 103 with dicing tape 104 therebetween.

During a cutting operation, the sawing blade spins at high speeds and the chuck table 103 moves the wafer 101 and its underlying layers towards the sawing blade 102. The sawing blade 102 then proceeds to cut through the wafer 101. The sawing blade 102 also cuts into but not entirely through the dicing tape 104, so that the dicing tape can help hold the dice together during the cutting operation. This process is repeated multiple times to cut the wafer 101 along the saw streets.

Once all of the cutting operations are completed, each die is lifted off of the dicing tape 104 and positioned onto a suitable substrate or lead frame (not shown). The die is adhered to its underlying substrate. In some implementations, the die is then electrically connected to the substrate and encapsulated in molding material to form an integrated circuit package.

Existing arrangements and methods for dicing semiconductor wafers exhibit backside damage and flying die for small die. There are continuing efforts to further improve the effectiveness of such techniques.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

In accordance with an embodiment of the present application, a method of sawing a semiconductor wafer is provided. The method of sawing a semiconductor wafer, comprising: providing a semiconductor wafer having an active device surface and a back surface; grinding the back surface of the wafer until the wafer reaches a desired thicknesss; applying an anchoring material to the back surface of the ground-down wafer; curing the anchoring material using heat; positioning the semiconductor wafer in a wafer sawing apparatus that includes a sawing blade and a movable support structure that physically supports the semiconductor wafer, wherein the semiconductor wafer is coupled with the support structure using a plurality of connecting layers including an anchoring material and a dicing tape; cutting the wafer and the anchoring material with the sawing blade, wherein during the cutting operation a contact portion of the sawing blade cuts a portion of the dicing tape; singulating the semiconductor wafer using the cutting operation to form a multiplicity of integrated circuit dice, each integrated circuit die having a top surface, an opposing bottom surface and side surfaces, the bottom surface of each integrated circuit die being covered with the anchoring material.

DESCRIPTION OF THE VIEWS OF THE DRAWING

The invention and the advantages thereof, may best be understood by reference to the following description taken in conjunction with the accompanying drawings in which.

In the drawings, like reference numerals are sometimes used to designate like structural elements. It should also be appreciated that the depictions in the figures are diagrammatic and not to scale.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The present invention generally relates to methods and arrangements for dicing a semiconductor wafer. More specifically, various embodiments of the present invention relate to a method of adding an anchoring layer to the back of the semiconductor wafer prior to dicing.

Conventional dicing techniques, although effective for many applications, can cause problems when using a mechanical saw blade to cut very small die size in the area of 0.2×0.2 millimeters (mm). Using the method illustrated in FIG. 1 problems like side wall chipping, back side chipping and die becoming detached from the dicing tape can occur.

Figure 1:
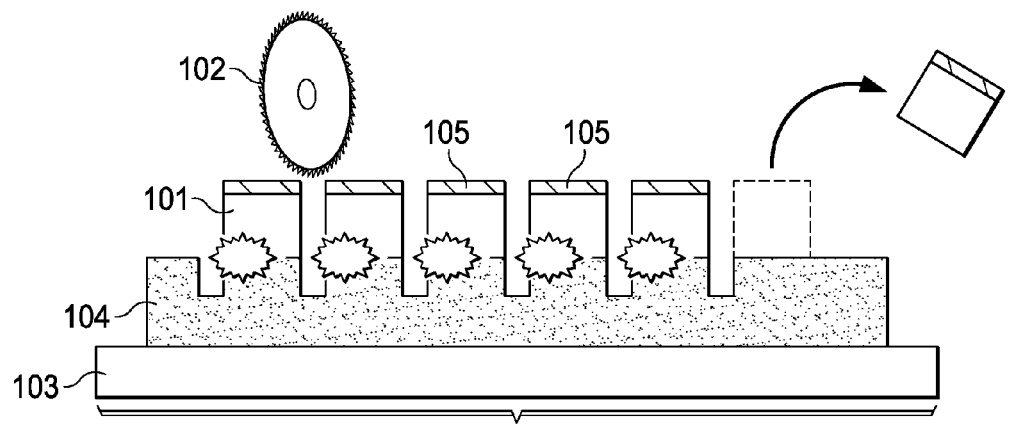
FIG. 1 is a diagrammatic side view of an example sawing blade and a semiconductor wafer that is coupled with a chuck table using a dicing tape.
Figure 2:
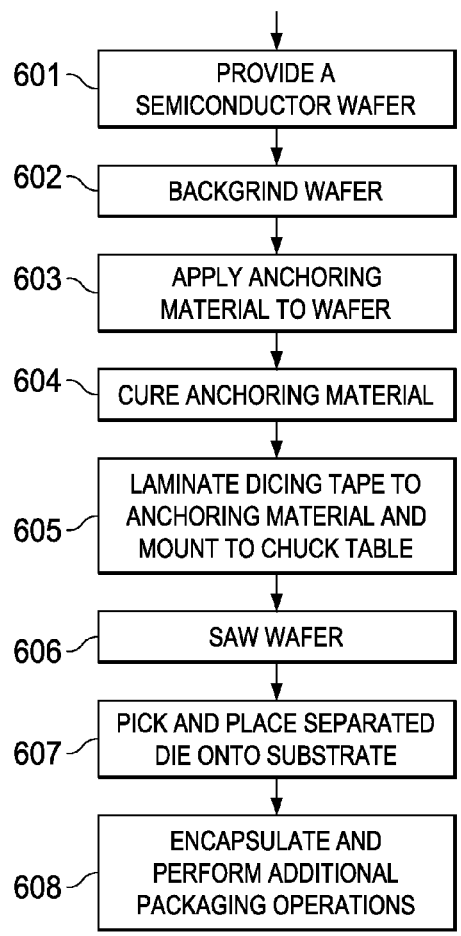
FIG. 2 is a flow chart illustrating the process of providing semiconductor wafer to assembly the die on that wafer into a packaged device.

As shown in FIG. 1, the semiconductor wafer 101 is attached to the dicing tape 104 with adhesive. During the mechanical sawing process, the mechanical sawing blade 102 cuts through the semiconductor wafer 101 and partially cuts the dicing tape 104. In the process of sawing, large size die chipping can occur at the semiconductor wafer 101, dicing tape 104 interface since the adhesive holding the two together is relatively weak. In addition, since the adhesive holding the two together is weak, the die can tilt and the spinning saw blade can engage the die and eject it from the dicing tape 104. These problems result in a higher number of defective die.

Various implementations of the present invention address one or more of the above problems. Referring next to FIGS. 2-9, an improved method for dicing and separating the die on a semiconductor wafer 101 according to embodiments of the present invention will be described.

Figure 3:
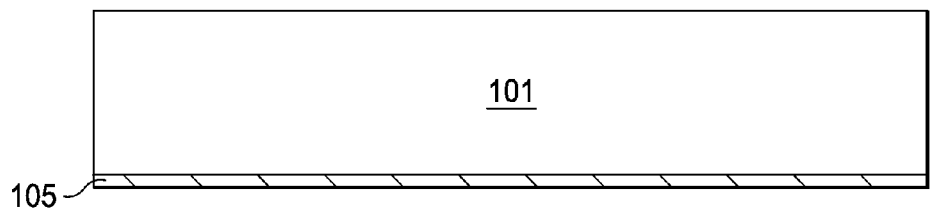
FIG. 3 illustrates a semiconductor wafer with active devices on one surface of the wafer.

Initially as described in step 601 and illustrated in FIG. 3, a semiconductor wafer 101 is provided, having a front surface including active devices 105 and a back surface.

Figure 4:
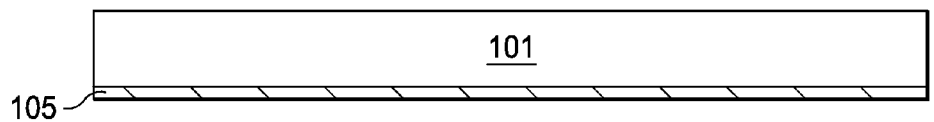
FIG. 4 illustrates a semiconductor wafer with active devices on one surface of the wafer after back grind.

Next, as described in step 602, and illustrated in FIG. 4, the back surface of the semiconductor wafer 101 is ground down to provide a final desired wafer thickness. Backgrinding of semiconductor wafers is a well know process in the semiconductor industry.

Figure 5:
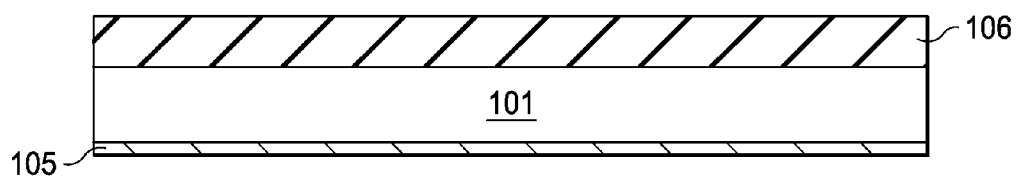
FIG. 5 illustrates a semiconductor wafer with active devices on one surface of the wafer after back grind with anchoring material applied to the back side.

Next, as described in step 603, and illustrated in FIG. 5, an anchoring material 106 is applied to the backside of the semiconductor wafer 101. The anchoring material can be applied by selecting from the group of lamination, printing or spin-on. The anchoring material can be composed of a polymer, having either electrically conductive material, non-conductive material or no material as a filler. The anchoring material is designed to have an elastic modulus >2400 MPa (@ room temp), a shear strength of >20 MPa (@ room temp) and a hardness equivalent or greater than silicon after curing. In practice, the attached anchoring material 106 is unified with the semiconductor wafer 101 by shear strength. The above properties allows for single pass sawing thus solving the problems of backside and side chipping damage and flying die, thereby improving yield and throughput.

Since the die are fixed firmly on the anchoring material 106, tests have shown a reduction of backside damage, especially on small die, of chips being reduced from 80 micrometers (um) to 10 um.

Figure 6:
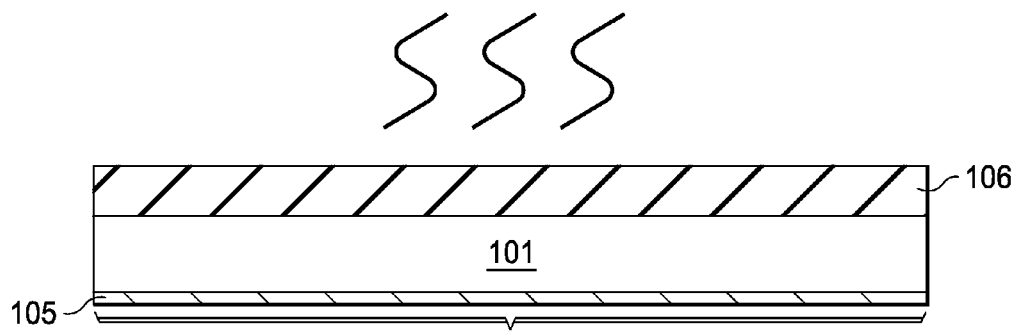
FIG. 6 illustrates the semiconductor wafer in FIG. 5 being baked to cure the anchoring material applied in FIG. 5.

Next as described in step 604, and illustrated in FIG. 6, the anchoring material is cured, with heat at temperatures between 150 and 180° C. for a minimum of 1 hour.

Figure 7:
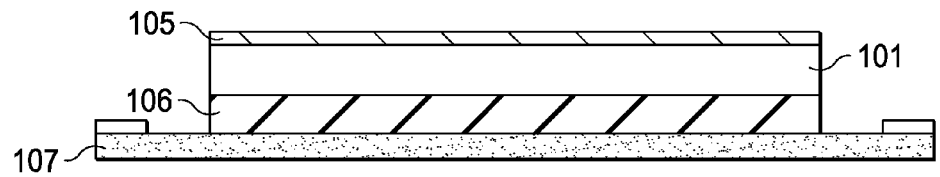
FIG. 7 illustrates the semiconductor wafer in FIG. 6 mounted on the dicing tape.

Next as described in step 605, and illustrated in FIG. 7, the semiconductor wafer 101 with anchoring material 106 attached is attached to dicing tape 107 with the anchoring material 106 touching the top surface of the dicing tape 107.

Figure 8:
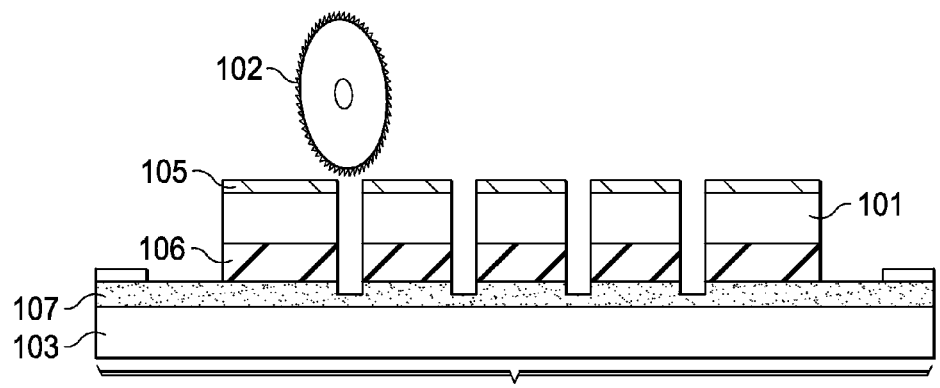
FIG. 8 illustrates the semiconductor wafer in FIG. 7 being sawed to singulate the individual die.

Next as described in step 606, and illustrated in FIG. 8 the semiconductor wafer 101, anchoring material 106 and dicing tape 107 combination is positioned on the chuck table 103 of a wafer sawing apparatus (not shown). FIG. 8 is a diagrammatic side view of a semiconductor wafer 101 and various components of a wafer sawing apparatus according to a particular embodiment of the present invention.

The wafer sawing apparatus (not show) includes a support structure 103 (e.g., a chuck table) for physically supporting the semiconductor wafer 101 and a sawing blade 102 for cutting the wafer 101.

At step 606 of FIG. 8, a sawing blade 102 is used to cut through the semiconductor wafer 101, the anchoring material 106 and partially into a portion of the dicing tape 107. In the illustrated embodiment of FIG. 8, the sawing blade 102 is positioned above the semiconductor wafer 101. The movement of the support structure 103 (chuck table) positions the semiconductor wafer 101, the dicing tape 107 and the anchoring material 106 therebetween against the spinning sawing blade 102 (step 606 of FIG. 8.) As a result, the sawing blade 102 cuts multiple layers, including the semiconductor wafer 101, the anchoring material 106 and partially into the dicing tape 107.

The sawing blade 102 used above may be any cutting instrument known in the art for cutting semiconductor wafers. In the illustrated embodiment, for example, the sawing blade 102 is circular, spins on its central axis and/or remains substantially stationary during the cutting process. In various embodiments, the sawing blade 102 used in step 606 may be thicker or thinner depending on the width of the saw streets on the semiconductor wafer 101. Some approaches involve the use of a diamond sawing blade.

The support structure 103 (chuck table) may be any suitable structure that is arranged to physically support and carry a semiconductor wafer and its underlying layers. Generally, the support structure 103 is arranged to move linearly towards the stationary sawing blade so that the sawing blade engages and cuts through portions of the wafer/anchoring material stack.

Figure 9:
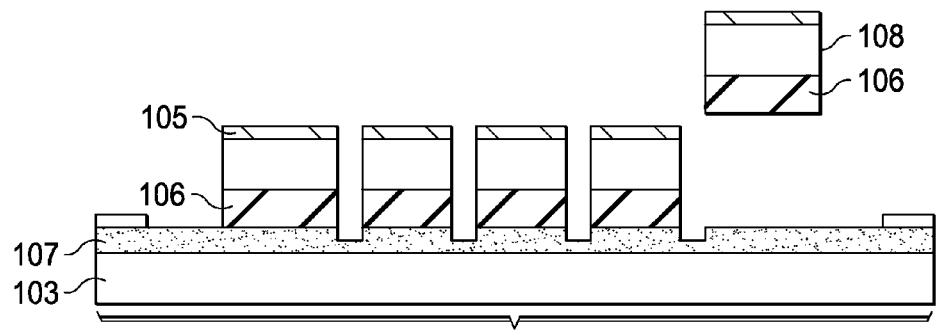
FIG. 9 illustrates a singulated die from the semiconductor wafer in FIG. 8 being picked for placement and mounting on a substrate.

At step 607 as illustrated in FIG. 9, the singulated integrated circuit dice 108 (and its underlying anchoring material 106) are then removed from the support structure and positioned on a suitable substrate (e.g., a lead frame.) Any suitable lead frame or electronic substrate design that is known in the art may be used in this step.

Figure 10:
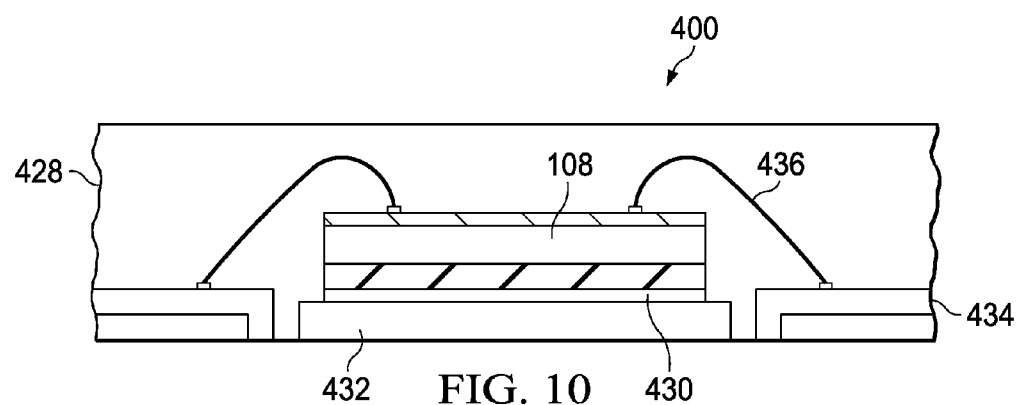
FIG. 10 is a diagrammatic view of a packaged die.

In the illustrated embodiment of FIG. 10, for example, the substrate is a lead frame panel with multiple device areas. Each device area includes multiple leads 434 and a die attach pad 432. At least one integrated circuit die 108 is secured to the die attach pad 432 using additional adhesive 430 on the die attach pad 432 to attach the die 108.

After the dice have been positioned on the substrate, additional packaging operations may be performed (step 608 as illustrated in FIG. 10). In the illustrated embodiment, for example, each die is electrically connected (e.g., using wire bonds 436) to leads 434 of its corresponding device area. Afterward, molding material 428 is applied to encapsulate portions of the substrate and the integrated circuit dice 424 substantially simultaneously to form a molded structure 400. The molded structure 400 is then singulated to form multiple integrated circuit packages. The die attach film 430 helps adhere the die 108 to the die attach pad 432 and the die 108 is electrically connected to at least one of the leads 434. The leads 434 are partially exposed on the exterior of the package to serve as electrical contacts for the integrated circuit package. The die attach film 430 can be utilized in connection with a wide variety of package designs, of which the design in FIG. 10 is but one example.

While various embodiments of the present invention have been described above, it should be understood that they have been presented by way of example only and not limitation.

Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of sawing a semiconductor wafer, comprising:

providing a semiconductor wafer having an active device surface and a back surface;

grinding the back surface of the wafer until the wafer reaches a desired thicknesss;

applying an anchoring material to the back surface of the ground-down wafer;

curing the anchoring material using heat;

positioning the semiconductor wafer in a wafer sawing apparatus that includes a sawing blade and a movable support structure that physically supports the semiconductor wafer, wherein the semiconductor wafer is coupled with the support structure using a plurality of connecting layers including an anchoring material and a dicing tape;

cutting the wafer and the anchoring material with the sawing blade, wherein during the cutting operation a contact portion of the sawing blade cuts a portion of the dicing tape;

singulating the semiconductor wafer using the cutting operation to form a multiplicity of integrated circuit dice, each integrated circuit die having a top surface, an opposing bottom surface and side surfaces, the bottom surface of each integrated circuit die being covered with the anchoring material.

2. The method as recited in claim 1 further comprising:

positioning a first die of the singulated dice on a device area of a substrate, wherein the anchoring material underlying the first die helps adhere the first die to the substrate;

electrically connecting the first die to the substrate; and encapsulating portions of the substrate and the die to form an integrated circuit package.

3. The method as recited in claim 2 wherein:

the substrate is a lead frame panel including a multiplicity of device areas;

the method further comprises positioning the multiplicity of integrated circuit dice on the device areas of the lead frame panel;

electrically connecting the multiplicity of integrated circuit dice to the lead frame panel;

encapsulating portions of the lead frame panel and the integrated circuit dice to form a molded panel; and singulating the molded panel to form a multiplicity of integrated circuit packages, each integrated circuit package including at least one of the integrated circuit dice.

4. The method as recited in claim 1, wherein the cutting operation does not involve cutting entirely through the dicing tape and wherein the dicing tape is arranged to help hold the singulated dice together after the cutting operation.

5. The method as recited in claim 1, wherein the anchoring material is composed of a polymer filled with either electrically conducting filler or non-conducting filler.

6. The method as recited in claim 1, wherein the anchoring material has an elastic modulus greater than 2400 MPa at room temperature, a shear strength of greater than 20 MPa at room temperature and a hardness equivalent or greater than silicon.

7. The method as recited in claim 1, wherein the anchoring material is cured at a temperature between 150 and 180° C. for a minimum of 1 hour.

8. The method as recited in claim 1, wherein the anchoring material application is selected from the group consisting of lamination, printing or spin-on.

* * * * *